(12) United States Patent
Hekmatshoar-Tabari et al.

(10) Patent No.: US 9,059,016 B1
(45) Date of Patent: Jun. 16, 2015

(54) LATERAL HETEROJUNCTION BIPOLAR TRANSISTORS

(71) Applicant: International Business Machines Corporation, Armonk, NY (US)

(72) Inventors: Bahman Hekmatshoar-Tabari, White Plains, NY (US); Tak H. Ning, Yorktown Heights, NY (US); Dae-Gyu Park, Poughquag, NY (US); Ghavam G. Shahidi, Pound Ridge, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/181,134

(22) Filed: Feb. 14, 2014

(51) Int. Cl.
*H01L 29/737* (2006.01)
*H01L 29/08* (2006.01)

(52) U.S. Cl.
CPC .................................. *H01L 29/0804* (2013.01)

(58) Field of Classification Search
CPC ..................... H01L 29/1008; H01L 29/0808
USPC ................ 257/197, 198, 511, 525, 556, 580;
438/204, 236, 325, 327
See application file for complete search history.

(56) References Cited

U.S. PATENT DOCUMENTS

| 5,282,341 | A  | 2/1994  | Baloga et al. |
| 5,452,547 | A  | 9/1995  | Baloga et al. |
| 5,651,219 | A  | 7/1997  | Baloga et al. |
| 5,687,513 | A  | 11/1997 | Baloga et al. |
| 5,929,468 | A  | 7/1999  | Asano |
| 6,246,104 | B1 | 6/2001  | Tsuda et al. |
| 6,563,146 | B1 | 5/2003  | Yuki et al. |
| 6,756,278 | B2 | 6/2004  | Yuki et al. |
| 8,557,670 | B1 | 10/2013 | Cai et al. |
| 2007/0295994 | A1 | 12/2007 | Mochizuki et al. |
| 2013/0256757 | A1 | 10/2013 | Cai et al. |

FOREIGN PATENT DOCUMENTS

| JP | 2232932  | 9/1990 |
| JP | 626218   | 1/1994 |
| JP | 20084807 | 1/2000 |

OTHER PUBLICATIONS

Ocevcic, H., et al., "Comparison of Hetero and Mono FET and BT Structures" TELSIKS 2005 Serbia and Montenegro, Nis, Sep. 28-30, 2005, pp. 597-600.

Simmons. J.G. et al., "A new ultra-high-speed heterojuncton transistor", Journal of the Institution of Electronic and Radio Engineers, Jan.-Feb. 1987, vol. 57, No. 1 (Supplement), pp. S13-S22.

*Primary Examiner* — Tan N Tran
(74) *Attorney, Agent, or Firm* — Scully, Scott, Murphy & Presser, P.C.; Louis J. Percello, Esq.

(57) ABSTRACT

A lateral heterojunction bipolar transistor is formed on a substrate including a top semiconductor layer of a first semiconductor material having a first band gap and of a first conductivity type. A stack of an extrinsic base and a base cap is formed over the top semiconductor layer. A dielectric spacer is formed around the stack. Ion implantation of dopants of a second conductivity type is performed to dope regions of the top semiconductor layer that are not masked by the stack and the dielectric spacer, thereby forming an emitter region and a collector region. A second semiconductor material having a second band gap greater than the first band gap, having a doping of the second conductivity type and being lattice matched to the first semiconductor material is selectively deposited to form an emitter contact region and a collector contact region, respectively.

19 Claims, 7 Drawing Sheets

LATERAL HETEROJUNCTION BIPOLAR TRANSISTORS

BACKGROUND

The present application relates to lateral bipolar junction transistor (BJT) structures. More particularly, the present application relates to lateral bipolar junction transistor (BJT) structures containing a wide band gap emitter contact and methods of forming the same.

Heterojunction bipolar junction transistors (HBTs) known in the art include a heterojunction, i.e., a junction of two semiconductor materials having different band gaps, that coincide with a p-n junction between the base and the emitter. The heterojunction at which two different semiconductor materials having different band gaps are joined coincide with the p-n junction. The wider band gap of the emitter relative to the band gap of the base in an HBT increases the current gain relative to a bipolar junction transistor employing a same semiconductor material across the base and the emitter and having similar physical dimensions and doping profiles for the base and emitter.

While the increase in the current gain obtained by an HBT is desirable, the heterojunction between two semiconductor materials having different band gaps may result in a lattice mismatch at the heterojunction. Dislocations are formed in the vicinity of the heterojunction to relieve the stress generated by the lattice mismatch. However, the dislocations in the vicinity of the p-n junction function as scattering centers for charge carriers, reducing the current flow between the emitter and the base. The dislocations may also act as generation and recombination centers, causing an undesirable increase in p-n junction leakage current. Thus, HBTs known in the art may suffer from the deleterious effect of the dislocation centers around the p-n junction despite the advantageous effect of providing a relatively high current gain through formation of the heterojunction between the emitter and the base. In view of the above, there is a need for forming a heterojunction in which dislocation formation is avoided.

SUMMARY

A lateral heterojunction bipolar transistor is formed on a substrate including a top semiconductor layer of a first semiconductor material having a first band gap and of a first conductivity type. A stack of an extrinsic base and a base cap is formed over the top semiconductor layer. A dielectric spacer is formed around the stack. Ion implantation of dopants of a second conductivity type is performed to dope regions of the top semiconductor layer that are not masked by the stack and the dielectric spacer, thereby forming an emitter region and a collector region. A second semiconductor material having a second band gap greater than the first band gap, having a doping of the second conductivity type and being lattice matched to the first semiconductor material is selectively deposited on the emitter region and the collector region forming an emitter contact region and a collector contact region, respectively.

According to an aspect of the present disclosure, a semiconductor structure including a bipolar junction transistor (BJT) is provided. In one embodiment, the BJT includes: a base region including a first portion of a first semiconductor material having a first band gap and having a doping of a first conductivity type; an emitter region including a second portion of the first semiconductor material, having a doping of a second conductivity type that is the opposite of the first conductivity type, and laterally contacting the base region; and an emitter contact region including a portion of a second semiconductor material having a second band gap that is greater than said first band gap, having a doping of the second conductivity type, being lattice matched to the first semiconductor material and contacting the emitter region.

In another embodiment, the BJT includes a base region located on a first portion of a semi-insulating material layer and comprising a first portion of a first semiconductor material having a first band gap and having a doping of a first conductivity type; and an emitter region located on a second portion of the semi-insulating material layer and comprising a portion of a second semiconductor material having a second band gap that is greater than the first band gap, having a doping of a second conductivity type that is opposite from the first conductivity type, being lattice matched to the semi-insulating material layer and contacting a sidewall surface of the base region. For this structure, the emitter region is itself a wide band gap semiconductor. As a result, there is no need to add a wide band gap semiconductor contact to the emitter region.

According to another aspect of the present disclosure, a method of forming a semiconductor structure including a bipolar junction transistor (BJT) is provided. In one embodiment, the method includes: providing a substrate including a semiconductor layer including a first semiconductor material having a first band gap and having a doping of a first conductivity type; converting a region of the semiconductor layer into an emitter region by introducing dopants of a second conductivity type that is the opposite of the first conductivity type into the region of the semiconductor layer, wherein a remaining region of the semiconductor layer constitutes a base region that laterally contacts the emitter region; and depositing an emitter contact region including a portion of a second semiconductor material having a second band gap that is greater than the first band gap, having a doping of the second conductivity type and being lattice matched to the first semiconductor material directly on the emitter region.

In one embodiment, the method includes: providing a substrate including a semiconductor layer located on a surface of a semi-insulating material layer and including a first semiconductor material having a first band gap and having a doping of a first conductivity type; converting a region of the semiconductor layer into an emitter region by introducing dopants of a second conductivity type that is the opposite of the first conductivity type into the region of the semiconductor layer, wherein a remaining region of the semiconductor layer constitutes a base region that laterally contacts the emitter region; removing an entirety of the emitter region to expose a portion of the semi-insulating material layer; and depositing another emitter region including a portion of a second semiconductor material having a second band gap that is greater than the first band gap, having a doping of the second conductivity type and being lattice matched to the semi-insulating material layer and directly contacting a sidewall surface of the base region. In this method, with the first semiconductor material forming the emitter region removed entirely, the second semiconductor material forming the emitter region is a wide band gap semiconductor. As such, there is no need to form a separate emitter contact for this embodiment of the present application.

DETAILED DESCRIPTION

The present application will now be described in greater detail by referring to the following discussion and drawings that accompany the present application. It is noted that the drawings of the present application are provided for illustrative purposes and, as such, they are not drawn to scale. In the drawings and the description that follows, like elements are referred to by like reference numerals. For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In the following description, numerous specific details are set forth, such as particular structures, components, materials, dimensions, processing steps and techniques, in order to provide a thorough understanding of the present invention. However, it will be appreciated by one of ordinary skill in the art that the present application may be practiced with viable alternative process options without these specific details. In other instances, well-known structures or processing steps have not been described in detail in order to avoid obscuring the various embodiments of the present application.

Figure 1A:
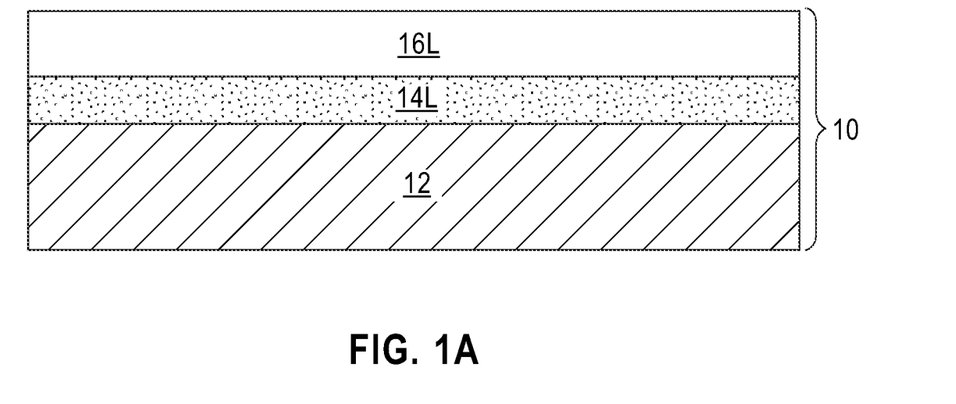
FIG. 1A is a vertical cross-sectional view of an exemplary semiconductor structure after providing a semiconductor-on-insulator (SOI) substrate including from bottom to top, a handle substrate, an insulator layer, and a top semiconductor layer according to an embodiment of the present application.
Figure 1B:
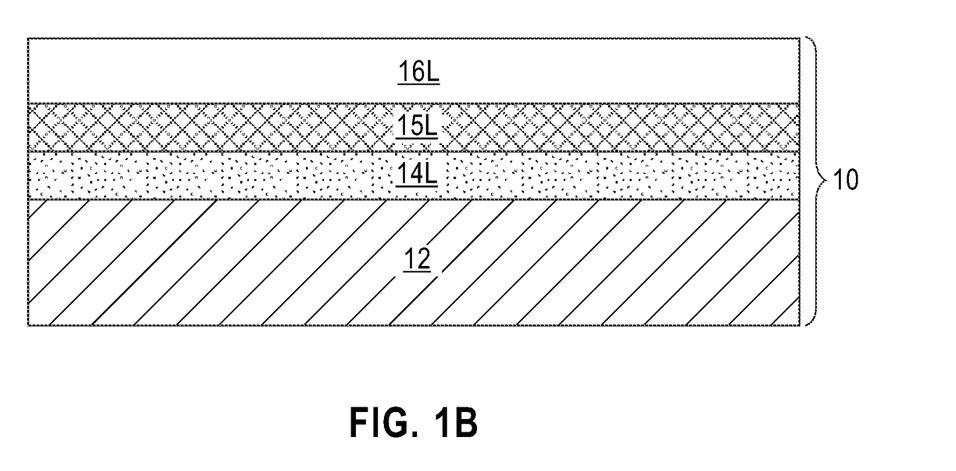
FIG. 1B is a vertical cross-sectional view of an exemplary semiconductor structure after providing a substrate that includes, from bottom to top, a handle substrate, an insulator layer, a semi-insulating material layer and a top semiconductor layer according to another embodiment of the present application.
Figure 1C:
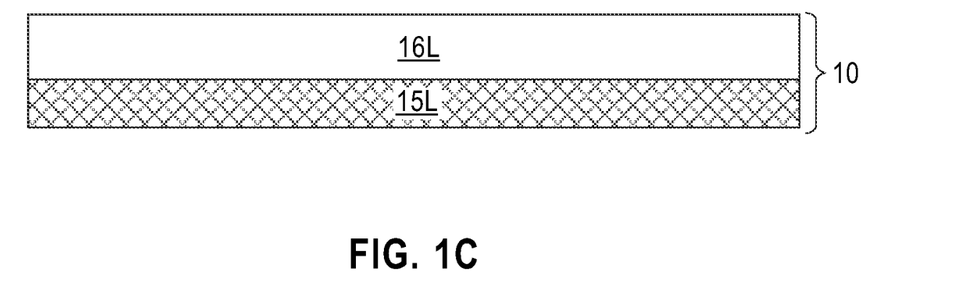
FIG. 1C is a vertical cross-sectional view of an exemplary semiconductor structure after providing a substrate that includes, from bottom to top, a semi-insulating material layer and a top semiconductor layer according to yet another embodiment of the present application.

Referring to FIGS. 1A, 1B and 1C, there are illustrated various exemplary semiconductor structures according to various embodiments of the present application which include substrate 10. In FIG. 1A, the substrate 10 includes at least a stack of a semiconductor layer 16L and an insulator layer 14L. For example, the substrate 10 shown in FIG. 1A can be a semiconductor-on-insulator (SOI) substrate including a stack of, from bottom to top, a handle substrate 12, an insulator layer 14L contacting a topmost surface of the handle substrate 12, and a top semiconductor layer 16L contacting the topmost surface of the insulator layer 14L. The top semiconductor layer 16L as provided can include a semiconductor material that extends across the entirety of the insulator layer 14L.

The substrate 10 shown in FIG. 1B includes, from bottom to top, a handle substrate 12, an insulator layer 14L, a semi-insulating layer 15L and a top semiconductor layer 16L. The substrate 10 shown in FIG. 1C includes a variation of the substrate 10 shown in FIG. 1B minus the handle substrate 12 and the insulating layer 14L. In the embodiments depicted in FIGS. 1B and 1C, the semi-insulating material layer 15L is a material that has both insulating and semiconductor properties and has a lower conductivity than a typical semiconductor material. Examples of semi-insulating materials that can be used in the present application include, but are not limited to, InP and GaAs. When a semi-insulating material layer 15L is present, the top semiconductor layer 16L may comprise the same or a different semiconductor material than the semi-insulating layer 15L.

The handle substrate 12 can include a semiconductor material, an insulator material, a conductor material, or a combination thereof. In one example, the handle substrate 12 can include a semiconductor material such as silicon or a silicon germanium alloy. If the handle substrate 12 includes a semiconductor material, the handle substrate 12 can be undoped or have a p-type doping or an n-type doping.

The insulator layer 14L includes a dielectric material such as silicon oxide and/or silicon nitride. For example, the insulator layer 14L can include thermal silicon oxide. The thickness of the insulator layer 14L can be from 5 nm to 1000 nm, and typically from 100 nm to 200 nm, although lesser and greater thicknesses can also be employed. The insulator layer 14L may, or may not, include multiple dielectric layers, e.g., a stack including at least a silicon oxide layer and a silicon nitride layer.

The top semiconductor layer 16L as provided in each substrate 10 can be a planar semiconductor material layer having a thickness from 5 nm to 1,000 nm. The semiconductor material that provides the top semiconductor layer 16L is herein referred to as a first semiconductor material. The first semiconductor material has a first band gap and has a doping of a first conductivity type. The first semiconductor material can be any semiconductor material known in the art provided that another semiconductor material having a greater band gap than the first semiconductor material exists.

In one embodiment, the first semiconductor material can be a single crystalline semiconductor material. In another embodiment, the first semiconductor material can be germanium or a silicon germanium alloy. In yet another embodiment, the first semiconductor material can be single crystalline germanium or a single crystalline silicon germanium alloy. In still another embodiment, the first semiconductor material can be a polycrystalline material.

In some embodiments, the top semiconductor layer 16L is disposed on top of a semi-insulating semiconductor material 15L such as, for example, semi-insulating InP or semi-insulating GaAs. An insulator layer 14L and a handle substrate 12 may or may not be present beneath the semi-insulating semiconductor layer 15L.

The first semiconductor material has a doping of a first conductivity type, i.e., doped with electrical dopants of the first conductivity type. The first conductivity type can be p-type or n-type. If the first semiconductor is a Group IV elemental semiconductor or a Group IV compound semiconductor and the first conductivity type is p-type, the electrical dopants can be, for example, B, Al, Ga, In, and/or Tl. If the first semiconductor is a Group IV elemental semiconductor or a Group IV compound semiconductor and the first conductivity type is n-type, the electrical dopants can be, for example, P, As, and/or Sb. The dopant concentration in the first semiconductor material can be from $1.0\times10^{15}/cm^3$ to $3.0\times10^{19}/cm^3$, although lesser and greater dopant concentrations can also be employed.

Each substrate 10 that is shown in FIGS. 1A, 1B and 1C can be formed utilizing techniques that are well known to those skilled in the art including, for example, a layer transfer process can be used to form the substrate 10 that is shown in FIGS. 1A and 1B, and the substrate 10 that is shown in FIG. 1C can be formed by epitaxial growth of layer 16L on a semi-insulating wafer (i.e., material layer 15L) wherein layer 16L is preferably doped in-situ during epitaxial growth although doping after epitaxial growth is also possible. Doping of the first semiconductor material that provides the top semiconductor layer 16L in FIGS. 1A and 1B may occur prior to or after performing a layer transfer process.

Figure 2:
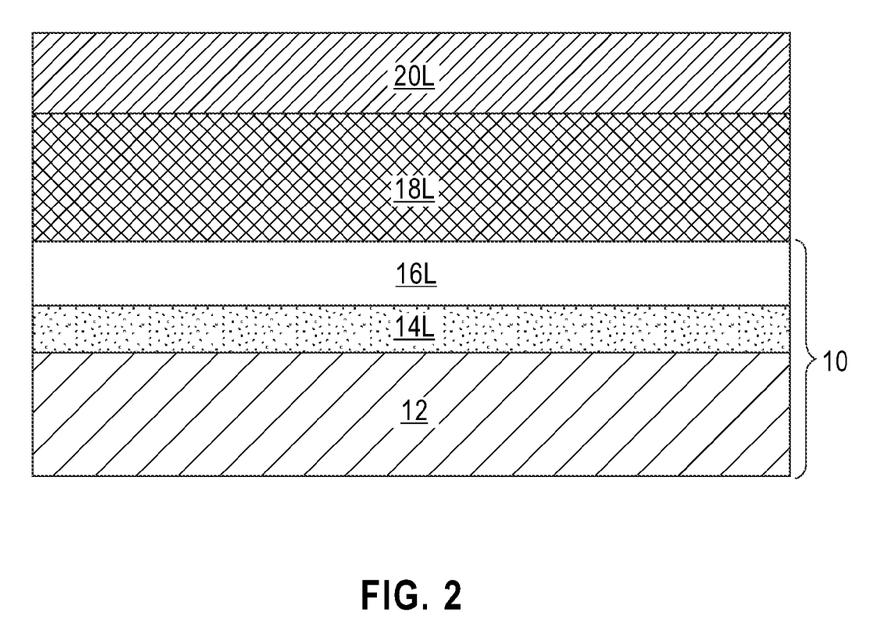
FIG. 2 is a vertical cross-sectional view of the exemplary semiconductor structure of FIG. 1A after deposition of an extrinsic base layer and a base cap layer according to an embodiment of the present application.

In some embodiments of the present application and after providing the substrate 10, and prior to preceding to forming the structure shown in FIG. 2, a trench isolation structure (not shown) can be formed at end portions of the top semiconductor layer 16L. Each trench isolation structure that is formed has a bottommost surface that contacts a topmost surface of the insulator layer 14L of substrate 10 in FIG. 1A or a topmost surface of the semi-insulating semiconductor layer 15L of substrate 10 in FIGS. 1B and 1C. Also, each trench isolation structure that is formed would have a sidewall surface that contacts a sidewall surface of a remaining portion of the top semiconductor layer 16L. Furthermore, each trench isolation structure that is formed would have a topmost surface that is coplanar with a topmost surface of a remaining portion of the top semiconductor layer 16L.

Each trench isolation structure can be formed utilizing a conventional trench isolation process. The trench isolation process includes forming a trench through top semiconductor layer 16L utilizing lithography and etching. Following trench formation, a trench dielectric material such as a trench dielectric oxide material can be formed into each trench. A densification process and/or a planarization process can follow the trench fill. For the sake of clarity, the trench isolation structures have been omitted from the drawings of the present application.

Referring to FIG. 2, there is illustrated the exemplary semiconductor structure of FIG. 1A after deposition of an extrinsic base layer 18L and a base cap layer 20L according to an embodiment of the present application. As is shown, the extrinsic base layer 18L and the base cap layer 20L are sequentially deposited over the top semiconductor layer 16L. Although the following description utilizes the structure shown in FIG. 1A, the exemplary semiconductor structures shown in FIGS. 1B and 1C can be subjected to the same processing steps as the exemplary semiconductor structure shown in FIG. 1A.

The extrinsic base layer 18L can be a doped semiconductor material layer having a doping of the first conductivity type. The doped semiconductor material of the extrinsic base layer 18L is herein referred to as an extrinsic base semiconductor material. The doped semiconductor material of the extrinsic base layer 18L is lattice matched to that of the first semiconductor material that provides the top semiconductor layer 16L of substrate 10. In one embodiment, the extrinsic base layer 18L includes a different semiconductor material than the top semiconductor layer 16L. In another embodiment, the extrinsic base layer 18L includes a same semiconductor material as the top semiconductor layer 16L. In one embodiment, the extrinsic base layer 18L can be polycrystalline or amorphous as deposited. In another embodiment, the top semiconductor layer 16L can be single crystalline, and the extrinsic base layer 18L can be epitaxially aligned to the top semiconductor layer 16L, and correspondingly, single crystalline.

The extrinsic base layer 18L has a doping of the first conductivity type. The extrinsic base layer 18L can be in-situ doped during deposition, or can be deposited as an intrinsic (or lightly doped) semiconductor material layer and subsequently doped (or further doped) by ion implantation, gas phase doping, plasma doping, or diffusion of electrical dopants from a disposable dopant source layer (such as a phosphosilicate glass layer, a borosilicate glass layer, or an arsenosilicate glass layer). In one embodiment, the extrinsic base layer 18L includes dopants of the first conductivity type at a greater dopant concentration than the concentration of dopants of the first conductivity type within the top semiconductor layer 16L. For example, the extrinsic base layer 18L includes dopants of the first conductivity type at a dopant concentration from $1.0\times10^{18}/cm^3$ to $3.0\times10^{21}/cm^3$, although lesser and greater dopant concentrations can also be employed. In one embodiment, the extrinsic base layer 18L can include a doped polycrystalline material having a doping of the first conductivity type. The extrinsic base layer 18L can be deposited, for example, by chemical vapor deposition (CVD) or physical vapor deposition (PVD). The thickness of the extrinsic base layer 18L can be from 10 nm to 1,000 nm, although lesser and greater thicknesses can also be employed.

The base cap layer 20L includes a dielectric material such as silicon oxide, silicon nitride, silicon oxynitride, a dielectric metal oxide, or a combination thereof. The base cap layer 20L can be deposited, for example, by chemical vapor deposition (CVD). The thickness of the base cap layer 20L can be from 10 nm to 1,000 nm, although lesser and greater thicknesses can also be employed. In one embodiment, the thickness of the base cap layer 20L can be selected to have the same stopping power as, or a greater stopping power than, the top semiconductor layer 16L for ion implantation, to be subsequently performed, of dopants of a second conductivity type that is the opposite of the first conductivity type.

Figure 3:
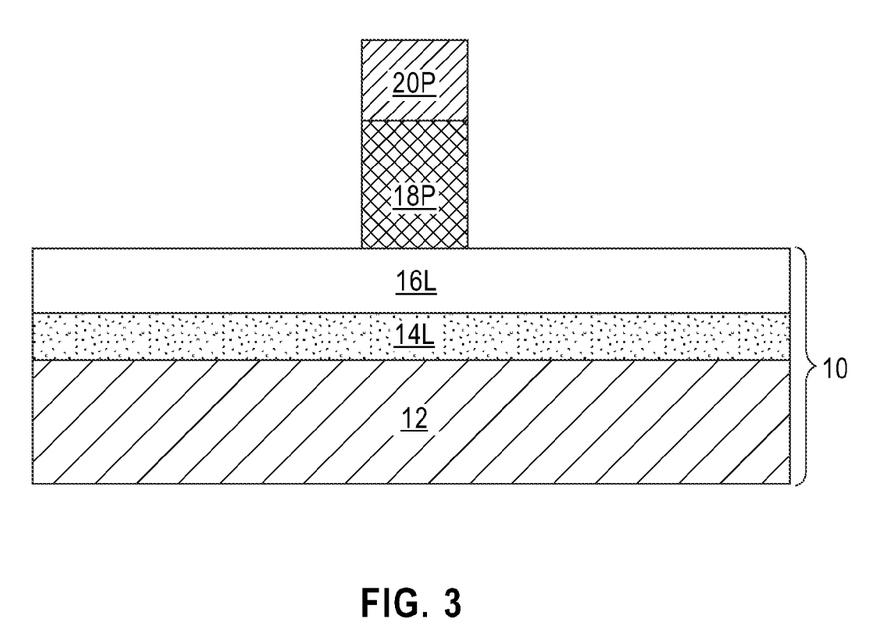
FIG. 3 is a vertical cross-sectional view of the exemplary semiconductor structure of FIG. 2 after patterning of the base cap layer and the extrinsic base layer according to an embodiment of the present application.

Referring to FIG. 3, there is illustrated the exemplary structure of FIG. 2 after the stack of the base cap layer 20L and the extrinsic base layer 18L is patterned, for example, by applying and lithographically patterning a photoresist layer (not show) and transferring the pattern in the patterned photoresist layer through the stack of the base cap layer 20L and the extrinsic base layer 18L. A remaining portion of the base cap layer 20L is herein referred to as a base cap 20P, and a remaining portion of the extrinsic base layer 18L is herein referred to as an extrinsic base region 18P. The transfer of the pattern from the patterned photoresist layer to the stack of the base cap layer 20L and the extrinsic base layer 18L can be effected by an anisotropic etch, in which case the sidewalls of the extrinsic base region 18P is vertically coincident (coincident in a top-down view) with sidewalls of the base cap 20P. Following the transfer of the pattern from the patterned photoresist layer to the stack of the base cap layer 20L and the extrinsic base layer 18L, the patterned photoresist layer can be removed utilizing a conventional resist stripping process such as, for example, ashing.

As is shown, the bottommost surface of the extrinsic base region 18P is in direct contact with a topmost surface of the top semiconductor layer 16L of substrate 10.

In some embodiments, if the first semiconductor material of the top semiconductor layer 16L is different from the extrinsic base semiconductor material, the endpointing of the anisotropic etch can be effected by detecting physical exposure of the top surface of the top semiconductor layer 16L through optical means or through detection of change of radical composition in the plasma of the anisotropic etch. Yet alternately or additionally, if there exists an interfacial layer such as a native oxide layer (having a thickness on the order of one atomic layer of a semiconductor oxide) at the interface between the top semiconductor layer 16L and the extrinsic base layer 18L, an etch chemistry that is highly selective to a semiconductor oxide can be employed to minimize an overetch into the top semiconductor layer 16L.

In one embodiment, physically exposed surfaces of the top semiconductor layer 16L after the anisotropic etch can be substantially coplanar with the interface between the top semiconductor layer 16L and the extrinsic base region 18P. In another embodiment, physically exposed surfaces of the top semiconductor layer 16L after the anisotropic etch can be recessed relative to the interface between the top semiconductor layer 16L and the extrinsic base region 18P. While the present application is described employing an anisotropic etch, an embodiment in which an isotropic etch such as a wet etch is employed to transfer the pattern in the patterned photoresist layer through the stack of the extrinsic base layer 18L and the base cap 20L is also contemplated. Use of an isotropic etch may be suitable if the lateral dimension of the extrinsic base region 18P is not critical for the purposes of application of a bipolar junction transistor to be formed. The extrinsic base region 18P includes the extrinsic base semiconductor material, has a doping of the first conductivity type, and provides an electrical contact to the portion of the top semiconductor layer 16L in contact with the extrinsic base region 18P.

Figure 4:
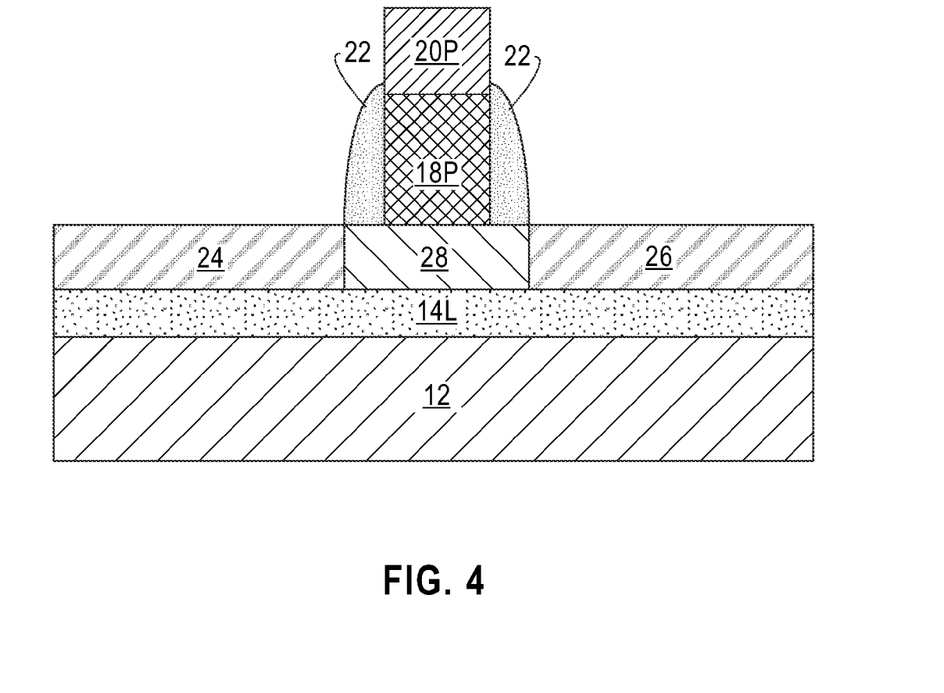
FIG. 4 is a vertical cross-sectional view of the exemplary semiconductor structure of FIG. 3 after formation of a dielectric spacer and the emitter and collector regions according to an embodiment of the present application.

Referring to FIG. 4, there is illustrated the exemplary structure of FIG. 3 after forming a dielectric spacer 22 on sidewall surfaces of the extrinsic base region 18P and surface portions of an exposed surface of the top semiconductor layer 16L that are proximal to the sidewall surfaces of the extrinsic base region 18P. The dielectric spacer 22 includes a dielectric material such as silicon oxide, silicon nitride, silicon oxynitride, organosilicate glass, or any dielectric material that can be employed to form a spacer as known in the art. In one embodiment, the material of the dielectric spacer 22 is selected to be different from the dielectric material of the base cap 20P so that the material of the base cap 20P can be subsequently removed selective to the material of the dielectric spacer 22.

The dielectric spacer 22 can be formed, for example, by conformal deposition of a dielectric material layer and subsequent anisotropic etch that removes the horizontal portions of the deposited dielectric material layer. The conformal deposition of the dielectric material layer can be performed, for example, by chemical vapor deposition (CVD), atomic layer deposition (ALD), or a combination thereof. The thickness of the dielectric spacer 22, as measured at the base that contact the top semiconductor layer 16L, can be from 10 nm to 300 nm, although lesser and greater thicknesses can also be employed. The dielectric spacer 22 is of unitary construction (in a single piece), and laterally contacts the sidewall surfaces of the extrinsic base region 18P and the base cap 20P. In one embodiment, the dielectric spacer 22 can include two layers, a first dielectric layer that is in contact with the sidewall surfaces of the extrinsic base region 18P and the exposed surface of the top semiconductor layer 16L, and a second dielectric layer that lies on top of the first dielectric layer.

Dopants of the second conductivity type are introduced into regions of the top semiconductor layer 16L that are not covered by the dielectric spacer 22 and the stack of the extrinsic base region 18P and the base cap 20P. The second conductivity type is the opposite of the first conductivity type. If the first conductivity type is p-type, the second conductivity type is n-type, and vice versa. The dopants of the second conductivity type can be introduced, for example, by ion implantation employing the combination of the dielectric spacer 22 and the stack of the extrinsic base region 18P and the base cap 20P as an implantation mask. An additional implantation mask (not shown) such as a patterned photoresist layer can also be employed if multiple devices (not shown) are present on the substrate 10.

Introduction of the dopants of the second conductivity type converts a first region of the top semiconductor layer 16L into an emitter region 24 and a second region of the top semiconductor layer 16L into a collector region 26. A remaining unimplanted region of the top semiconductor layer 16L constitutes a base region 28 that laterally contacts the emitter region 24 and the collector region 26. The conversion of two regions of the top semiconductor layer 16L into the emitter region 24 and the collector region 26, respectively, is performed simultaneously. Each of the emitter region 24 and the collector region 26 laterally contacts the base region 28 upon formation.

The base region 28 includes a first portion of the first semiconductor material, has the first band gap, and has a doping of the first conductivity type. The emitter region 24 includes a second portion of the first semiconductor material, has a doping of the second conductivity type that is the opposite of the first conductivity type, and laterally contacts the base region 28. The collector region 26 includes a third portion of the first semiconductor material, has a doping of the second conductivity type, laterally contacts the base region 28, and is spaced from the emitter region 24 by the base region 28. In one embodiment, the emitter region 24 and the collector region 26 can have a same dopant concentration of dopants of the second conductivity type. The net dopant concentration of dopants of the second conductivity type, i.e., the concentration of the dopants of the second conductivity type less the concentration of dopants of the first conductivity type, in the emitter region 24 and the collector region 26 can be, for example, from $1.0 \times 10^{17}/cm^3$ to $3.0 \times 10^{20}/cm^3$, although lesser and greater dopant concentrations can also be employed. In another embodiment, a masking layer (not shown) can be employed to provide asymmetric net dopant concentration of dopants of the second conductivity type across the emitter region 24 and the collector region 26.

The location of the boundary between the base region 28 and the emitter region 24 and the location of the boundary between the base region 28 and the collector region 26 is determined by the location of the outer sidewall of the dielectric spacer 22, the lateral straggle of implanted ions of the second conductivity type, and the subsequent diffusion of the implanted ions. In the embodiment drawn and illustrated, the boundary between the base region 28 and the emitter region 24 and the boundary between the base region 28 and the collector region 26 are both vertical coincident to the outermost surface of the spacers 22. If the ion implantation is performed along a surface normal of the top semiconductor layer 16L, the lateral offset of the boundary between the base region 28 and the emitter region 24 from the bottommost portion of the outer sidewall of the dielectric spacer 22 over the emitter region 24 can be the same as the lateral offset of the boundary between the base region 28 and the collector region 26 from the bottommost portion of the outer sidewall of the dielectric spacer 22 over the collector region 26. In one embodiment, the thickness of the base cap 20P and the thickness of the extrinsic base region 18P are selected for ion implantation of dopants of the second conductivity type such that dopants of the second conductivity type reach the bottommost region of the extrinsic base region 18P, while not penetrating into the base region 28.

In some embodiments (not shown), the bottom surface of the dielectric spacer 22 can be in contact with a peripheral portion of the top surface of the emitter region 24, a peripheral portion of the top surface of the collector region 26, and two disjoined peripheral portions of the top surface of the base region 28. This occurs to the lateral straggle of implanted ions and the subsequent diffusion of the implanted ions. In one embodiment, the entirety of the interface between the base region 28 and the extrinsic base region 18P can be substantially coplanar with the entirety of the top surface of the emitter region 24 and the entirety of the top surface of the collector region 26. The insulator layer 12L of substrate 10 has a planar top surface that contacts the base region 28, the emitter region 24, and the collector region 26.

Figure 5:
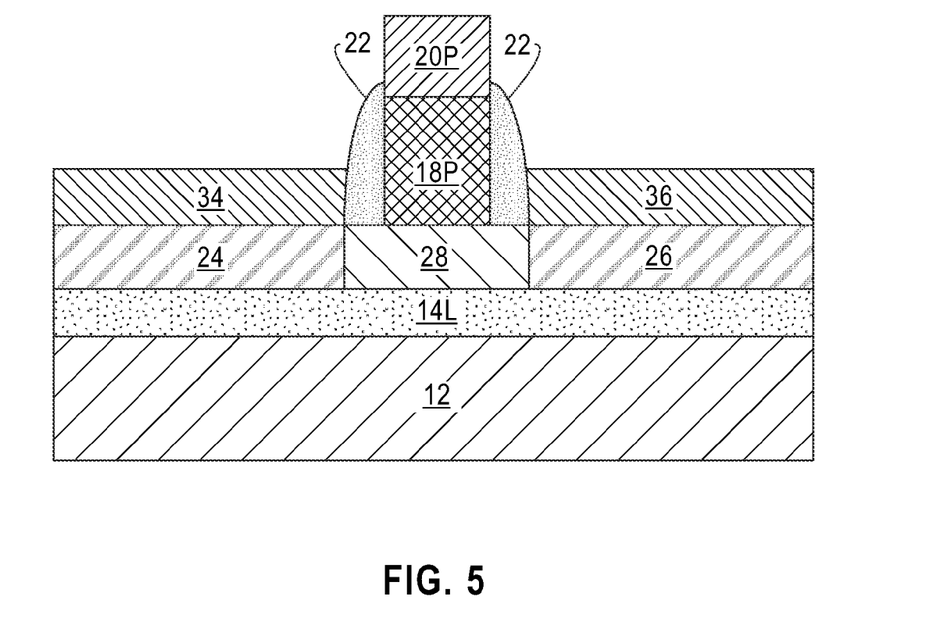
FIG. 5 is a vertical cross-sectional view of the exemplary semiconductor structure of FIG. 4 after selective deposition of an emitter contact region and a collector contact region according to an embodiment of the present application.

Referring to FIG. 5, a second semiconductor material having a second band gap that is greater than the first band gap is selectively deposited on the semiconductor surfaces of the emitter region 24 and the collector region 26, while not growing from dielectric surfaces of the exemplary structure. The second semiconductor material can be any semiconductor material such as the specifically listed semiconductor material for the first semiconductor material or any other semiconductor material known in the art, provided that the second band gap of the second semiconductor material is greater than the first band gap of the first semiconductor material. Also, the second semiconductor material that is formed at this point of the present application must be lattice matched to the first semiconductor material that provides the emitter region 24 and the collector region 26. The lattice matching between the first and the second material facilitates a substantially defect free interface between the two materials substantially eliminating the recombination of minority carriers at the interface. In addition, the lattice matching eliminates the mechanical strain created by the otherwise lattice mismatched materials preventing the creation of structural defects such as dislocations that can act as recombination centers in the bulk of the two materials. In particular, the second material which is grown on top of the first material is prone to the creation of structural defects resulting from the accumulation of mechanical stain due to lattice mismatch.

The second semiconductor material is deposited employing a selective deposition process, in which the second semiconductor material grows from semiconductor surfaces and does not grow from dielectric surfaces. The second semiconductor material that grows on, and from, the emitter region 24 constitutes an emitter contact region 34, and the second semiconductor material that grows on, and from, the collector region 26 constitutes a collector contact region 36. In other words, the second semiconductor material is selectively deposited on the physically exposed surface of the emitter region 24 and the physically exposed surface of the collector region 26, while the second semiconductor material does not grow from surfaces of the dielectric spacer 22, or the base cap 20P.

As the emitter contact region 34 grows with continued deposition of the second semiconductor material during the selective deposition process, the emitter contact region 34 comes into contact with a lower portion of an outer sidewall of the dielectric spacer 22. Likewise, as the collector contact region 36 grows with continued deposition of the second semiconductor material during the selective deposition process, the collector contact region 36 comes into contact with a lower portion of another outer sidewall of the dielectric spacer 22. The thickness of the emitter contact region 34 and the collector contact region 36 is less than the height of the dielectric spacer 22, and can be from 1 nm to 1,000 nm, although lesser and greater thicknesses can also be employed.

In one example, a chemical vapor deposition (CVD) process is used for the selective deposition process. During the selective deposition process, at least one semiconductor precursor gas is flowed into a process chamber to deposit the second semiconductor material on physically exposed semiconductor surfaces of the emitter region 24 and the collector region 26. In some embodiments, at least one etchant gas is included in the gas mixture. In such an embodiment, the at least one semiconductor precursor gas and the at least one etchant gas can be any combination that enable selective deposition of the second semiconductor material as known in the art. Non-limiting examples of the at least one semiconductor precursor gas for Si, Ge or SiGe containing materials include $SiH_4$, $SiH_2Cl_2$, $SiHCl_3$, $SiCl_4$, $Si_2H_6$, $GeH_4$, $Ge_2H_6$, and other precursor gases for depositing the selected second semiconductor material. Non-limiting examples of the at least one etchant gas include HCl. In another non-limiting example where the second material is comprised of GaAs, the precursor gas is a mixture of trimethylgallium (TMGa) and $AsH_3$. In another non-limiting example where the second material is comprised of InP, the precursor gas is a mixture of trimethylindium (TMIn) and $PH_3$. In some embodiments, He, H and combination thereof may be used as carrier gases for InP and GaAs growth. In another example, molecular beam epitaxy (MBE) is used for the selective epitaxial growth of GaAs and InP using solid and/or vapor sources.

In one embodiment, the emitter contact region 34 and the collector contact region 36 can be doped in-situ during the selective deposition of the second semiconductor material. Formation of the emitter contact region 34 and the collector contact region 36 with in-situ doping can be effected by flowing a dopant gas including a dopant atom of the second conductivity type concurrently with, or alternately with, the at least one semiconductor precursor gas and the at least one etchant gas. In one example where the contact regions are comprised of Si, Ge and SiGe containing materials, if the second conductivity type is n-type, the dopant gas can be, for example, $PH_3$, $AsH_3$, $SbH_3$, or a combination thereof; and if the second conductivity type is p-type, the dopant gas can be, for example, $B_2H_6$. In another example where the contact regions are comprised of GaAs or InP based materials, dopant gases used for n-type doping include, but are not limited to, $SiH_4$, $Si_2H_6$, tetraethyltin (TESn), and the dopant gases used for p-type doping may include, but are not limited to, trimethylaluminum (TMAl), bis(methylcyclopentadienyl)magnesium (MCp2Mg), and dimethylzinc (DMZn).

In another embodiment, the emitter contact region 34 and the collector contact region 36 can be deposited as intrinsic second semiconductor material portions by selective deposition of an intrinsic second semiconductor material, and can be subsequently doped by implanting dopants of the second conductivity type. In one example where the emitter and collector contact regions are comprised of GaAs, n-type doping is achieved by implantation of Se, Te, Se/Ga and combinations thereof, and n-type doping is achieved by implantation of Si, Be, Mg, C, C/Ga and combinations thereof.

The emitter contact region 34 and the collector contact region 36 can have a concentration of dopants of the second conductivity type, for example, from $1.0 \times 10^{19}/cm^3$ to $3.0 \times 10^{21}/cm^3$, although lesser and greater dopant concentrations can also be employed. In one embodiment, the concentration of dopants of the second conductivity type in the emitter contact region 34 and the collector contact region 36 can be greater than the net dopant concentration of dopants of the second conductivity type in the emitter region 24 and the collector region 26.

In one embodiment, the entirety of the base region 28, the emitter region 24, and the collector region 26 can be single crystalline. In one embodiment, the selective deposition of the second semiconductor material can be effected by performing selective epitaxy of the second semiconductor material. The second semiconductor material deposited in the emitter contact region 34 can be epitaxially aligned to the first semiconductor material in the emitter region 24, and the second semiconductor material deposited in the collector contact region 36 can be epitaxially aligned to the first semiconductor material in the collector region 26. In other words, the emitter contact region 34 can be epitaxially aligned to a single crystalline structure of the emitter region 24, and the collector contact region 36 can be epitaxially aligned to a single crystalline structure of the collector region 26. In this case, the entirety of the base region 28, the emitter region 24, the collector region 26, the emitter contact region 34, and the collector contact region 36 can be single crystalline and epitaxially aligned among one another.

Thus, the emitter contact region 34 including a portion of the second semiconductor material that is lattice matched to the underlying emitter region 24, having the second band gap that is greater than the first band gap, and having a doping of the second conductivity type is deposited directly on the emitter region 24. The collector contact region 36 including another portion of the second semiconductor material that is lattice matched to the underlying collector region 26 is deposited directly on the collector region 26 simultaneously with the deposition of the emitter contact region 24.

In one embodiment, the first semiconductor material can be a first III-V semiconductor compound and the second semiconductor material is a second III-V semiconductor compound that is lattice matched to, but differs from, the first III-V semiconductor compound. In one example, the first III-V semiconductor compound is InGaAs and the second III-V semiconductor compound is InP. In another example, the first III-V semiconductor compound is GaAsSb and the second III-V semiconductor compound is InP. In yet another example, the first III-V semiconductor compound is InGaAs and the second III-V semiconductor compound is InAlAs. In a further example, the first III-V semiconductor compound is GaAsSb and the second III-V semiconductor compound is InAlAs.

Other examples of lattice matched materials that can be employed in the present application include the following: Ge as the first semiconductor material and GaAs as the second semiconductor material; Ge or GaAs as the first semiconductor material and InGAP or AlGaAs as the second semiconductor material; and Si as the first semiconductor material and GaN or GaP as the second semiconductor material.

In one embodiment, and as shown, the dielectric spacer 22 contacts the emitter contact region 34 and the collector contact region 36. In another embodiment (not shown), the dielectric spacer 22 can be in contact with the base region 28, the emitter region 24, the emitter contact region 34, the collector region 26 that contacts the base region 28, and the collector contact region 36. In yet another embodiment (not shown), the dielectric spacer 22 is in contact with the emitter region 24, the emitter contact 34, a collector region 26 that contacts the base region 28, and a collector contact region 36. This is the case in which the lateral straggle of the implanted ions and the post-implantation diffusion of the implanted ions result in the emitter-base interface and the collector-base interface to be located under the extrinsic base region 18P and not under the dielectric spacer 22. In this case, the spacer 22 does not contact the base region 28.

Figure 6:
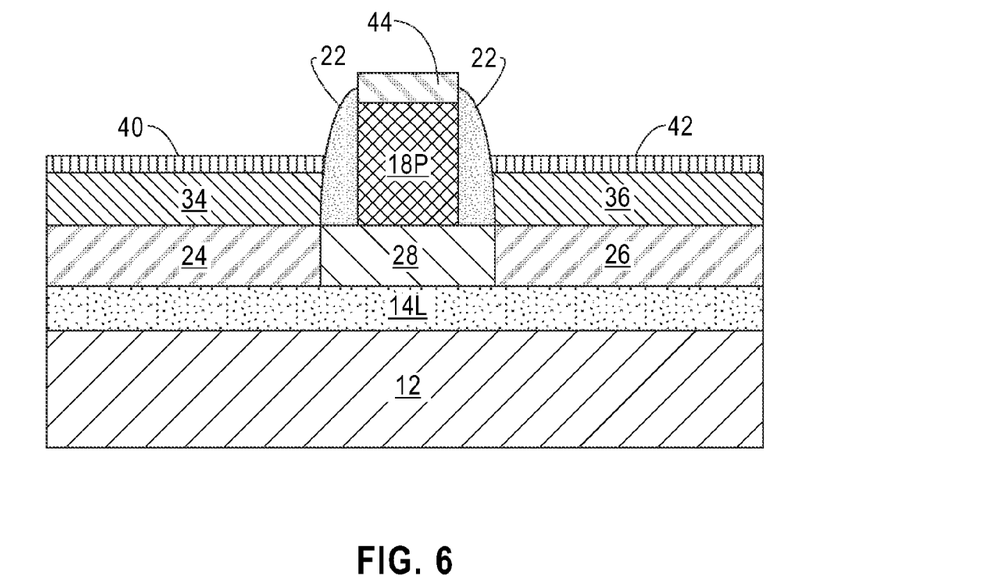
FIG. 6 is a vertical cross-sectional view of the exemplary semiconductor structure of FIG. 5 after formation of metal semiconductor alloy regions according to an embodiment of the present application.

Referring to FIG. 6, there is illustrated the exemplary structure of FIG. 5 after optional formation of metal semiconductor alloy regions. In one embodiment, the base cap 20P is removed selective to the dielectric materials of the dielectric spacer 22 and the trench isolation structures (not shown) and the second semiconductor material of the emitter contact region 34 and the collector contact region 36. For example, if the base cap 20P includes silicon nitride, and the trench isolation structures and the dielectric spacer 22 includes silicon oxide, a wet etch employing hot phosphoric acid can be employed to remove the base cap 20P selective to the dielectric materials of the dielectric spacer 22 and the trench isolation structures and the second semiconductor material of the emitter contact region 34 and the collector contact region 36.

The metal semiconductor alloy regions can be subsequently formed, for example, by depositing a metal layer, inducing formation of the metal semiconductor alloy regions during an anneal at an elevated temperature, and subsequently removing unreacted portions of the metal layer selective to the metal semiconductor alloy regions. If the second semiconductor material and/or the extrinsic base semiconductor material include silicon and/or germanium, the various metal semiconductor alloy regions can contain a metal silicide, a metal germanide, and/or a metal germano-silicide. The various metal semiconductor alloy regions can include, for example, an emitter-side metal semiconductor alloy region 40, a collector-side metal semiconductor alloy region 42, and a base-side metal semiconductor alloy region 44.

Figure 7:
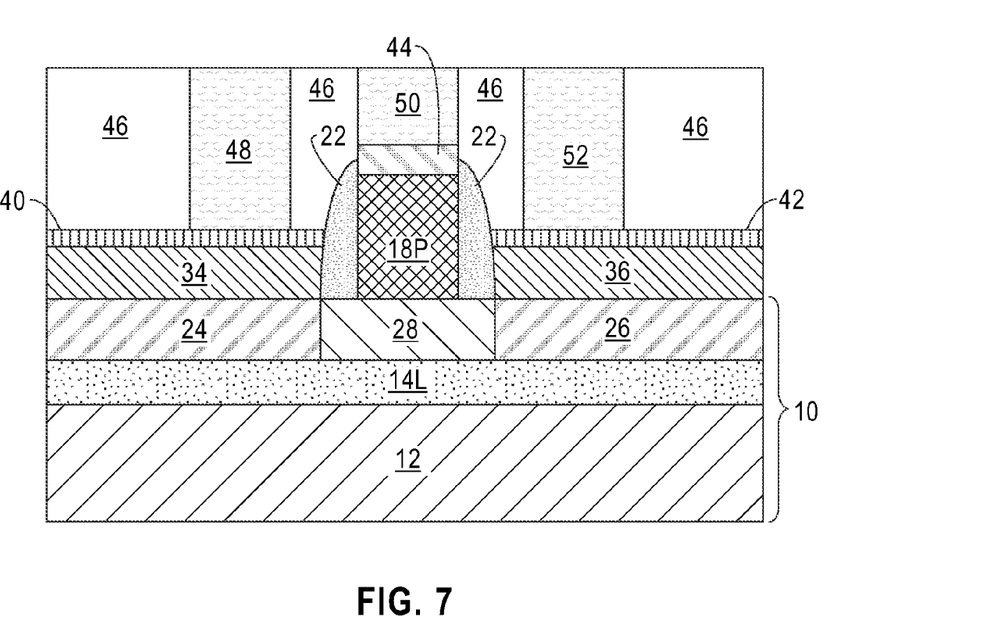
FIG. 7 is a vertical cross-sectional view of the exemplary semiconductor structure of FIG. 8 after formation of a contact-level dielectric layer and contact via structures according to an embodiment of the present application.

Referring to FIG. 7, there is illustrated the exemplary structure of FIG. 6 after formation of various contact structures within a contact-level dielectric material layer 46. In some embodiments, a contact-level dielectric material layer having various contact structure can be formed on the exemplary structure shown in FIG. 5.

Notably, a contact-level dielectric material layer 46 can be deposited and then various contact via structures can be formed to provide electrical contact to the emitter-side metal semiconductor alloy region 40 (or the emitter contact region 34 if an emitter-side metal semiconductor alloy region is not present), a collector-side metal semiconductor alloy region 42 (or the collector contact region 36 if a collector-side metal semiconductor alloy region is not present), and a base-side metal semiconductor alloy region 44 (or the extrinsic base region 18P if a base-side metal semiconductor alloy region is not present). The contact-level dielectric material layer 46 can include undoped silicate glass (i.e., silicon oxide), doped silicate glass, organosilicate glass, or any other dielectric material known in the art that can be employed for forming interconnect structures. The various contact via structures can include an emitter-side contact via structure 48, a base-side contact via structure 50, and a collector-side contact via structure 52.

Figure 8A:
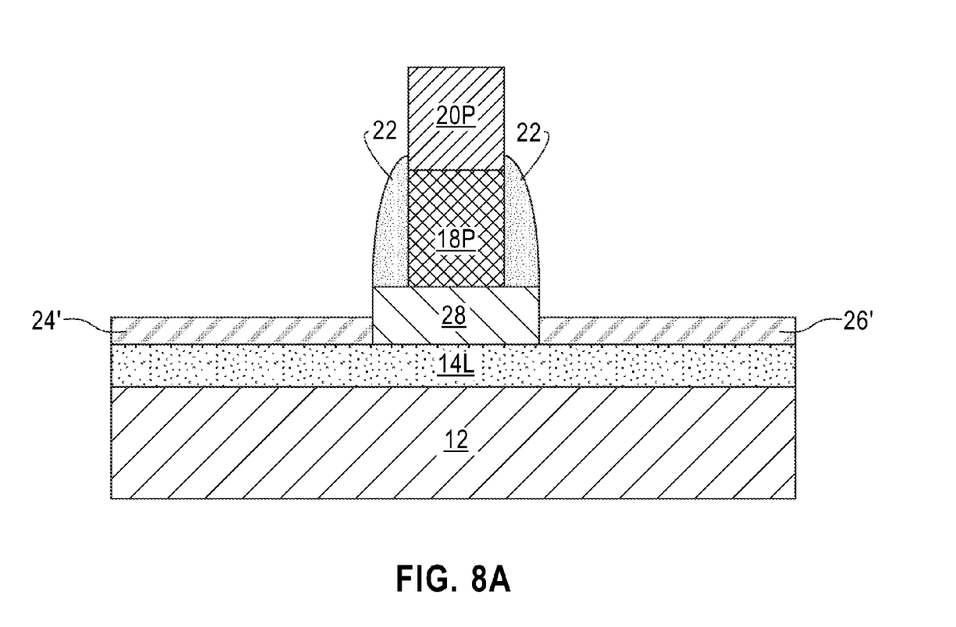
FIG. 8A is a vertical cross-sectional view of the exemplary semiconductor structure shown in FIG. 4 after partially recessing the emitter region and the collector region in accordance with an embodiment of the present application.

Referring to FIG. 8A, there is illustrated the exemplary semiconductor structure shown in FIG. 4 after partially recessing the emitter region 24 and the collector region 26 in accordance with an embodiment of the present application. The partial recessing occurs prior to forming the emitter contact region 34 and the collect contact region 36. The remaining portion of the emitter region 24 is referred to as a recessed emitter region 24', while the remaining portion of the collector region 26 is referred to as a recessed collector region 26'. As shown, the recessed emitter region 24' has a topmost surface the is vertically offset and located beneath the topmost surface of the base region 28, while the recessed collector region 34' has a topmost surface that is vertically offset and located beneath the topmost surface of the base region 28.

Figure 8B:
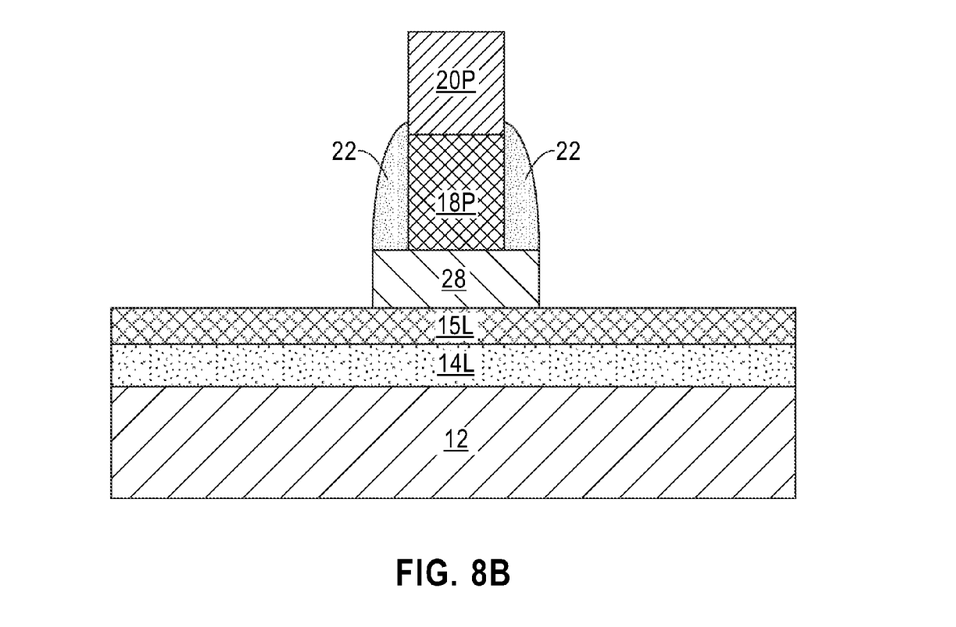
FIG. 8B is a vertical cross-sectional view of the exemplary semiconductor structure shown in FIG. 1B after performing the processing steps described and illustrated in FIGS. 2-4 and after entirely recessing the emitter region and the collector region in accordance with an embodiment of the present application.

Referring to FIG. 8B, there is illustrated the exemplary semiconductor structure shown in FIG. 1B after performing the processing steps described and illustrated in FIGS. 2-4 and after entirely recessing the emitter region 24 and the collector region 26 in accordance with an embodiment of the present application. In this embodiment, the complete removal of the emitter region 24 and the collector region 26 exposes a surface of the semi-insulating material layer 15L. Similar processing may be performed on the structure shown in FIG. 1C. In this embodiment, the emitter contact region (grown subsequently on the exposed emitter region 24) serves as an emitter region as well, i.e., the emitter contact region and the emitter region are comprised of the same material. Similarly, the collector contact region (grown subsequently on the exposed collector region 26) serves as the collector region as well, i.e., the collector contact region and the collector region are comprised of the same material.

The structures shown in FIGS. 8A and 8B can be provided utilizing an etching process that selectively removes at least a portion, or the entirety, of each of the emitter region 24 and the collector region 26. In embodiment example, the etch can be an anisotropic etching process which may or may not be timed. In on example, the etch may include reactive ion etching utilizing the base cap 20P, the base region 18P and the dielectric spacer 22 as a combined etch mask.

Figure 9A:
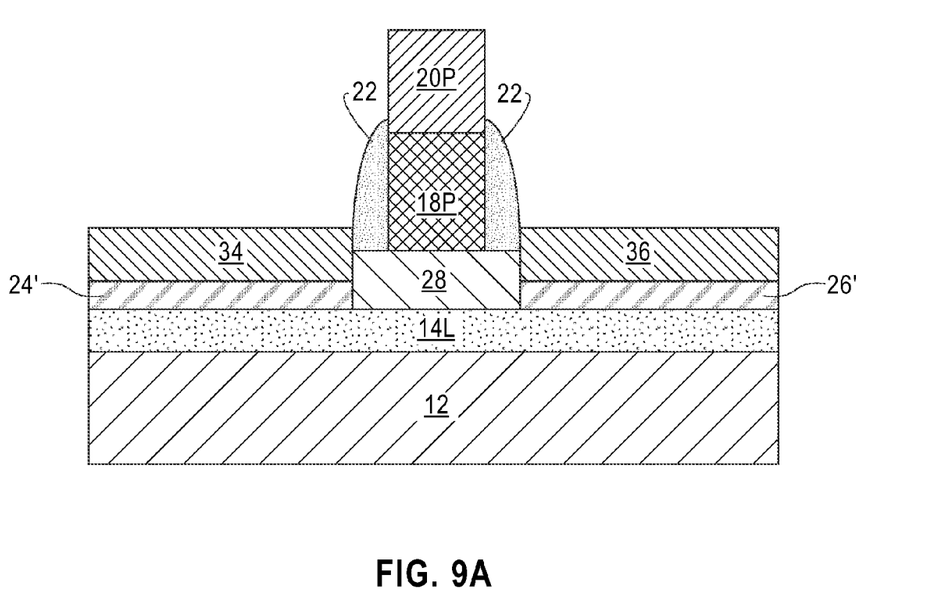
FIG. 9A is a vertical cross-sectional view of the exemplary semiconductor structure of FIG. 8A after formation of an emitter contact region and a collector contact region in accordance to an embodiment of the present application.

Referring now to FIG. 9A, there is illustrated the exemplary semiconductor structure of FIG. 8A after forming the emitter contact region 34 and the collector contact region 36. The structure shown in FIG. 9A can be are formed utilizing the technique mentioned above in providing the emitter contact region 34 and the collector contact region 36 as shown in FIG. 5.

Figure 9B:
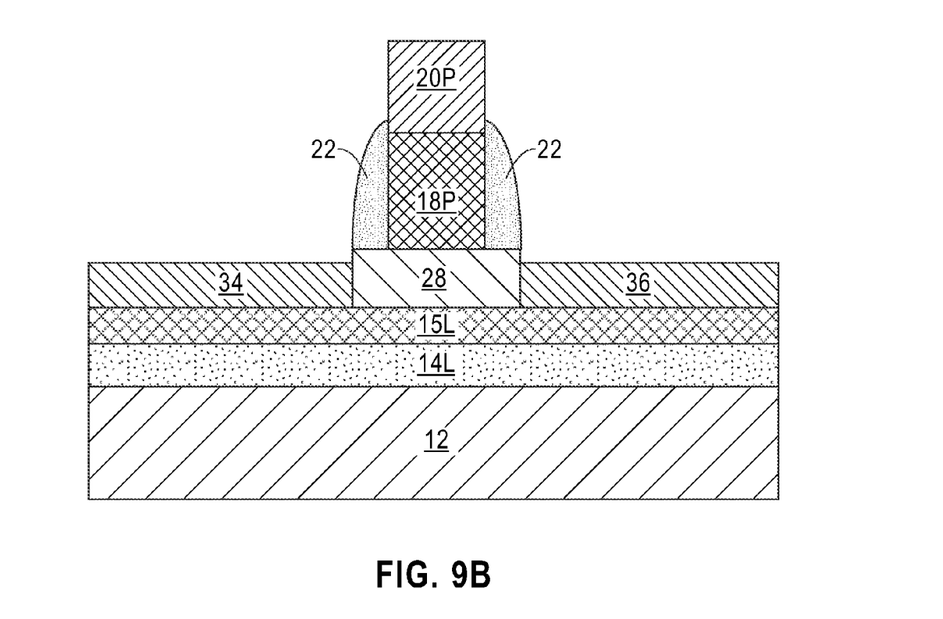
FIG. 9B is a vertical cross-sectional view of the exemplary semiconductor structure of FIG. 8B after formation of an emitter region and a collector region in accordance to an embodiment of the present application.

Referring now to FIG. 9B, there is illustrated the exemplary semiconductor structure of FIG. 8B after forming an emitter region 70 and a collector region 72. The structure shown in FIG. 9B can be are formed utilizing the technique mentioned above in providing the emitter contact region 34 and the collector contact region 36 as shown in FIG. 5. In this embodiment, the emitter region 70 and the collector region 72 are wide band gap semiconductor materials that are latticed matched to the underlying surface of the semi-insulating semiconductor layer 15L.

In the case of the structure shown in FIG. 9B, the thickness of the emitter region 70 and the thickness of the collector region 72 are less than the thickness of the base region 28 so that no portion of the emitter region 70 or the collector region 72 contacts a surface of dielectric spacer 22. In one embodiment, the thickness of the emitter region 70 and the thickness of the collector region 72 may be greater than the thickness of the base region 28 so that a portion of the emitter region 70 and a portion of the collector region 72 may contact a portion of a surface of dielectric spacer 22. Also, in the embodiment of the present application illustrated in FIG. 9B, a bottommost surface of the emitter region 70 contacts a portion of a topmost surface of the semi-insulating layer 15L, while a bottommost surface of the collector region 72 contacts another portion of the topmost surface of the semi-insulating material layer 15L. Also, and as shown in FIG. 9B, the topmost surface of the emitter region 70 and the collector region 72 are vertically offset and located beneath a topmost surface of the base region 28. It is noted that in the embodiment of the present application shown in FIG. 9B, the emitter region 70 and the collector region 72 comprise a second semiconductor material that is lattice matched to the exposed portions of the semi-insulating material layer 15L.

Figure 10A:
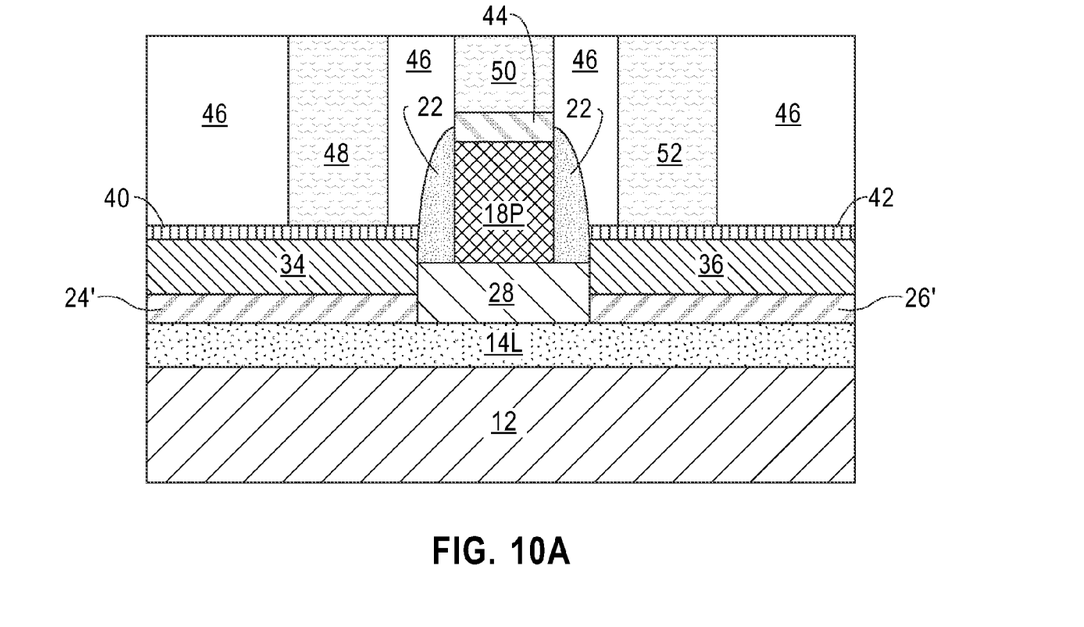
FIGS. 10A-10B are vertical cross-sectional view of the exemplary semiconductor structures of FIGS. 9A-9B, after performing the processing steps shown in FIGS. 6 and 7.
Figure 10B:
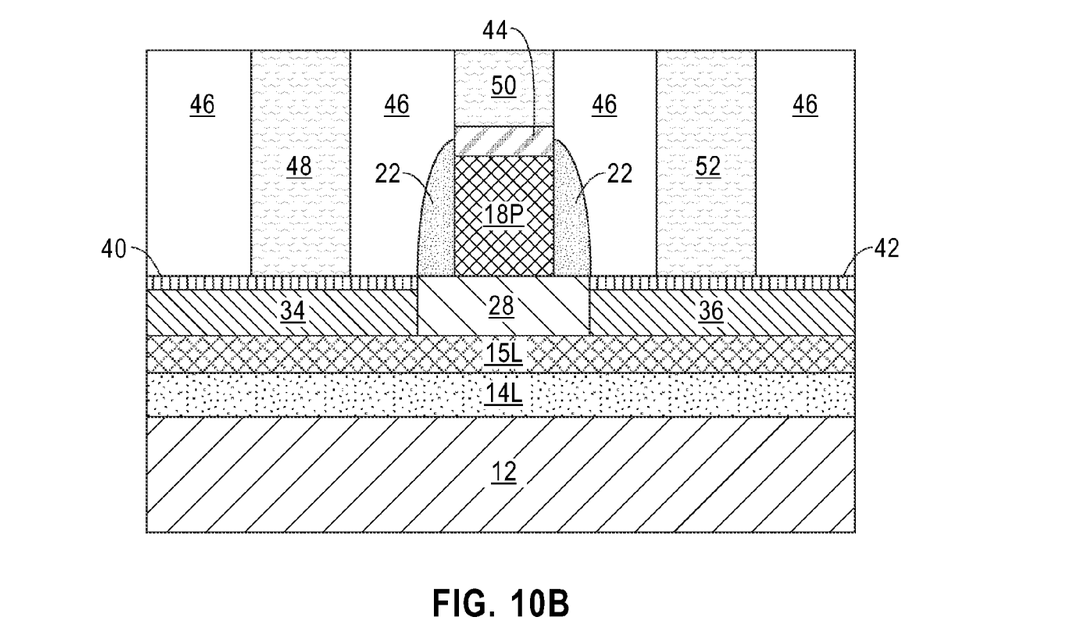

Referring now to FIGS. 10A-10B, there are illustrated the exemplary semiconductor structures of FIGS. 9A-9B, after performing the processing steps shown in FIGS. 6 and 7.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising a bipolar junction transistor (BJT), wherein said BJT comprises:
    a base region comprising a first portion of a first semiconductor material having a first band gap and having a doping of a first conductivity type;
    an emitter region comprising a second portion of said first semiconductor material, having a doping of a second conductivity type that is the opposite of said first conductivity type, and laterally contacting said base region; and
    an emitter contact region comprising a portion of a second semiconductor material having a second band gap that is greater than said first band gap, having a doping of said second conductivity type, being lattice matched to the first semiconductor material and contacting said emitter region.

2. The semiconductor structure of claim 1, wherein said emitter contact region is not in physical contact with said base region.

3. The semiconductor structure of claim 1, wherein said BJT further comprises a collector region comprising a third portion of said first semiconductor material, and having a doping of said second conductivity type, laterally contacting said base region, and spaced from said emitter region by said base region.

4. The semiconductor structure of claim 3, wherein said BJT further comprises a collector contact region comprising another portion of said second semiconductor material, having a doping of said second conductivity type, being lattice matched to the first semiconductor material and contacting said collector region.

5. The semiconductor structure of claim 3, further comprising an insulator layer having a planar top surface that contacts said base region, said emitter region, and said collector region.

6. The semiconductor structure of claim 3, wherein said emitter region and said collector region have the same dopant concentration of dopants of said second conductivity type.

7. The semiconductor structure of claim 6, further comprising a collector contact region comprising another portion of said second semiconductor material, having a doping of said second conductivity type, being lattice matched to the first semiconductor material and contacting said collector region.

8. The semiconductor structure of claim 1, wherein said BJT further comprises an extrinsic base region comprising an extrinsic base semiconductor material, vertically contacting said base region, and having a doping of said first conductivity type.

9. The semiconductor structure of claim 8, further comprising a dielectric spacer laterally contacting sidewalls of said extrinsic base region.

10. The semiconductor structure of claim 1, wherein said base region and said emitter region each having a bottommost surface that directly contacts a topmost surface of a semi-insulating semiconductor material.

11. A semiconductor structure comprising a bipolar junction transistor (BJT), wherein said BJT comprises:
a base region located on a first portion of a semi-insulating material layer and comprising a first portion of a first semiconductor material having a first band gap and having a doping of a first conductivity type; and
an emitter region located on a second portion of said semi-insulating material layer and comprising a portion of a second semiconductor material having a second band gap that is greater than said first band gap, having a doping of a second conductivity type that is opposite from the first conductivity type, being lattice matched to said semi-insulating material layer and contacting a sidewall surface of said base region.

12. The semiconductor structure of claim 11, further comprising:
a collector region located on a third portion of said semi-insulating material layer and comprising another portion of said second semiconductor material having said second band gap that is greater than said first band gap, having a doping of said second conductivity type, being lattice matched to said semi-insulating material layer and contacting another sidewall surface of said base region.

13. A method of forming a semiconductor structure including a bipolar junction transistor (BJT), said method comprising:
providing a substrate including a semiconductor layer comprising a first semiconductor material having a first band gap and having a doping of a first conductivity type;
converting a region of said semiconductor layer into an emitter region by introducing dopants of a second conductivity type that is the opposite of said first conductivity type into said region of said semiconductor layer, wherein a remaining region of said semiconductor layer constitutes a base region that laterally contacts said emitter region; and
depositing an emitter contact region comprising a portion of a second semiconductor material having a second band gap that is greater than said first band gap, having a doping of said second conductivity type and being lattice matched to the first semiconductor material directly on said emitter region.

14. The method of claim 13, further comprising forming an extrinsic base region on a portion of a top surface of said semiconductor layer and forming a dielectric spacer on sidewalls of said extrinsic base region and on said semiconductor layer.

15. The method of claim 14, further comprising selectively depositing said second semiconductor material on a surface of said emitter region, while said second semiconductor material does not grow from surfaces of said dielectric spacer.

16. The method of claim 15, wherein said selective deposition of said second semiconductor material is effected by performing selective epitaxy of said second semiconductor material, wherein said emitter contact region is epitaxially aligned to a single crystalline structure of said emitter region.

17. The method of claim 14, wherein said extrinsic base region is formed by:
depositing an extrinsic base layer comprising an extrinsic base semiconductor material having a doping of said first conductivity type on said semiconductor layer; and
patterning said extrinsic base layer by an etch, wherein a remaining portion of said extrinsic base layer constitutes said extrinsic base region.

18. The method of claim 13, further comprising converting another region of said semiconductor layer into a collector portion by introducing dopants of said second conductivity type into said another region of said semiconductor layer simultaneously with said conversion of said region into said emitter region, wherein said collector region laterally contacts said base region upon formation; and depositing a collector contact region comprising another portion of said second semiconductor material directly on said collector region simultaneously with said deposition of said emitter contact region.

19. A method of forming a semiconductor structure including a bipolar junction transistor (BJT), said method comprising:
providing a substrate including a semiconductor layer located on an surface of a semi-insulating material layer and including a first semiconductor material having a first band gap and having a doping of a first conductivity type;
converting a region of said semiconductor layer into an emitter region by introducing dopants of a second conductivity type that is opposite of said first conductivity type into said region of said semiconductor layer, wherein a remaining region of said semiconductor layer constitutes a base region that laterally contacts said emitter region;
removing an entirety of said emitter region to expose a portion of said semi-insulating material layer; and
depositing another emitter region including a portion of a second semiconductor material having a second band gap that is greater than said first band gap, having a doping of said second conductivity type and being lattice matched to said semi-insulating material layer and directly contacting a sidewall surface of said base region.

* * * * *